(12) United States Patent
Bae et al.

(10) Patent No.: US 7,667,178 B2
(45) Date of Patent: Feb. 23, 2010

(54) IMAGE SENSOR, METHOD OF MANUFACTURING THE SAME, AND METHOD OF OPERATING THE SAME

(75) Inventors: Jeong-hoon Bae, Seoul (KR); Tae-seok Oh, Seoul (KR); Ki-hong Kim, Yongin-si (KR); Hyoun-min Baek, Yongin-si (KR); Won-je Park, Yongin-si (KR); Jung-ho Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 196 days.

(21) Appl. No.: 12/010,362

(22) Filed: Jan. 24, 2008
(Under 37 CFR 1.47)

(65) Prior Publication Data

US 2009/0045321 A1    Feb. 19, 2009

(30) Foreign Application Priority Data

Jan. 24, 2007    (KR) ...................... 10-2007-0007665

(51) Int. Cl.
*H01L 31/0352* (2006.01)
*H01L 31/18* (2006.01)
(52) U.S. Cl. .................. 250/208.1; 250/214.1; 257/292; 257/461; 257/464; 257/225; 257/E27.131; 438/57
(58) Field of Classification Search .............. 250/208.1, 250/214.1, 226; 348/57; 257/225, 292, 440, 257/461, 464, E27.131, E27.132, E27.133, 257/E31.001; 438/57, 73
See application file for complete search history.

(56) References Cited

U.S. PATENT DOCUMENTS

| 6,392,307 | B1 * | 5/2002 | Okawa et al. ............... 257/786 |
| 7,180,150 | B2 | 2/2007 | Min |
| 7,214,974 | B2 | 5/2007 | Shin |
| 7,244,632 | B2 | 7/2007 | Min |
| 7,271,430 | B2 | 9/2007 | Park et al. |
| 2009/0045321 | A1 * | 2/2009 | Bae et al. ................. 250/208.1 |

FOREIGN PATENT DOCUMENTS

| KR | 10-2005-0069083 | 7/2005 |
| KR | 10-2005-0069521 | 7/2005 |
| KR | 10-2005-01115813 A | 12/2005 |
| KR | 10-2006-0010899 | 2/2006 |

* cited by examiner

*Primary Examiner*—John R Lee
(74) *Attorney, Agent, or Firm*—Lee & Morse, P.C.

(57) ABSTRACT

An image sensor includes a photoelectric conversion section in a semiconductor substrate, the photoelectric conversion section having a capping layer of a first conductivity type and a photodiode of a second conductivity type below the capping layer, the photodiode having an upper surface deeper than about 1 μm, as measured from an upper surface of the semiconductor substrate, a charge detection section receiving charges stored in the photoelectric conversion through a charge transfer section and converting the received charges into respective electrical signals, a voltage application section adapted to apply voltage to the capping layer and to a lower portion of the semiconductor substrate to control a width of a depletion layer on the photodiode, and a signal operation section adapted to generate red, green, and blue, signals according to signals from the charge detection section.

21 Claims, 11 Drawing Sheets

IMAGE SENSOR, METHOD OF MANUFACTURING THE SAME, AND METHOD OF OPERATING THE SAME

BACKGROUND OF THE INVENTION

1. Field of the Invention

Embodiments of the present invention relate to an image sensor, a method of manufacturing the same, and a method of operating the same. More particularly, embodiments of the present invention relate to an image sensor having improved color reproducibility, a method of manufacturing the same, and a method of operating the same.

2. Description of the Related Art

In general, an image sensor refers to a device capable of converting an optical image, i.e., light, into an electrical signal. Such image sensors may be implemented in various cameras, e.g., digital cameras, camcorders, video cameras, and/or medical cameras, personal communication systems (PCS), game equipment, robots, and so forth.

The conventional image sensor may include a plurality of unit pixels, each unit pixel having a photodiode and a corresponding color filter to detect a predetermined color of light. More specifically, each unit pixel of an image sensor may be formed to detect and reproduce a predetermined wavelength of light via its corresponding color filter, so the plurality of unit pixels of the image sensor may reproduce a complete image based on red, green, and blue colors in a form of an electrical signal. For example, a Bayer-type image sensor may have a structure including unit pixels arranged in groups of four, i.e., two unit pixels corresponding to a green color, one unit pixel corresponding to a red color, and one unit pixel corresponding to a blue color, in order to reproduce electrical signals corresponding to images including red, green, and blue colors. Accordingly, the conventional image sensor may require at least three unit pixels in order to obtain information corresponding to the red, green, and blue colors, thereby lowering color reproducibility of the image sensor. Further, manufacturing of conventional image sensors may require complex manufacturing techniques for forming the color filters, long processing time, and high manufacturing costs, thereby resulting in a low yield.

SUMMARY OF THE INVENTION

Embodiments of the present invention are therefore directed to an image sensor, a method of manufacturing the same, and a method of operation the same, which substantially overcome one or more of the disadvantages related art.

It is therefore a feature of an embodiment of the present invention to provide an image sensor having improved color reproducibility.

It is another feature of an embodiment of the present invention to provide a method of manufacturing an image sensor having improved color reproducibility.

It is still another feature of an embodiment of the present invention to provide a method of operating an image sensor having improved color reproducibility.

At least one of the above and other features and advantages of the present invention may be realized by providing an image sensor, including a photoelectric conversion section in a semiconductor substrate, the photoelectric conversion section having a capping layer of a first conductivity type and a photodiode of a second conductivity type below the capping layer, the photodiode being positioned to have an upper surface thereof deeper than about 1 µm, as measured from an upper surface of the semiconductor substrate, a charge transfer section adapted to receive charges stored in the photoelectric conversion section, the charges correspond to light incident on the photoelectric conversion section, a charge detection section adapted to receive the charges from the charge transfer section and to convert the received charges into respective electrical signals, a voltage application section adapted to apply voltage to the capping layer and to a lower portion of the semiconductor substrate to control a width of a depletion layer on the photodiode, and a signal operation section adapted to receive the electrical signals from the charge detection section to generate red, green, and blue signals.

The photoelectric conversion section may further include a dopant layer of the first conductivity type between the capping layer and the photodiode. The dopant layer may be in direct contact with the photodiode. A maximum dopant concentration of the photodiode may be at least five times higher than a maximum dopant concentration of the dopant layer. The depletion layer may overlap with the dopant layer. The signal operation section may be adapted to perform a Fourier transform with respect to the electrical signals from the charge detection section. The semiconductor substrate may be of the first conductivity type or of the second conductivity type. The image sensor may further include a vertical blooming path between the lower portion of the semiconductor substrate and the photodiode. The image sensor may further include a vertical barrier layer along the photoelectric conversion section.

At least one of the above and other features and advantages of the present invention may be further realized by providing a method of manufacturing an image sensor, the method including forming a photoelectric conversion section with a capping layer of a first conductivity type and a photodiode of a second conductivity type below the capping layer in a semiconductor substrate, the photodiode formed such that an upper surface thereof is deeper than about 1 µm, as measured from an upper surface of the semiconductor substrate, forming a charge transfer section adapted to receive charges stored in the photoelectric conversion section, the charges correspond to light incident on the photoelectric conversion section, forming a charge detection section adapted to receive the charges from the charge transfer section and to convert the received charges into respective electrical signals, forming a voltage application section adapted to apply voltage to the capping layer and a lower portion of the semiconductor substrate to control a width of a depletion layer on the photodiode, forming a signal operation section adapted to receive the electrical signals generated by the charge detection section to generate red, green, and blue signals.

Forming the photoelectric conversion section may include injecting first conductivity type dopant ions into the semiconductor substrate, such that a dopant layer is formed between the capping layer and the photodiode. Forming the photoelectric conversion section may include injecting second conductivity type dopant ions into the semiconductor substrate to form the photodiode, such that a maximum dopant concentration in the photodiode is at least five times higher than a maximum dopant concentration in the dopant layer. Forming the photoelectric conversion section may include adjusting a dopant concentration of the dopant layer to be substantially equal to a dopant concentration of the photodiode at a depth of about 1 µm or deeper, as measured from the upper surface of the semiconductor surface.

At least one of the above and other features and advantages of the present invention may be further realized by providing a method of operating an image sensor including a semiconductor substrate, a charge detection section, a charge transfer section, a voltage application section, a signal operation section, and a photoelectric conversion section having a capping layer of a first conductivity type and a photodiode of a second conductivity type below the capping layer in the semiconductor substrate, the photodiode being positioned to have an upper surface thereof deeper than about 1 μm, as measured from an upper surface of the semiconductor substrate, the method including radiating light toward the semiconductor substrate, applying a first voltage to the capping layer and a lower portion of the semiconductor substrate by the voltage application section to form a first depletion layer on the photodiode, generating a first signal by the charge detection section, applying a second voltage to the capping layer and the lower portion of the semiconductor substrate by the voltage application section to form a second depletion layer on the photodiode, generating a second signal by the charge detection section in accordance, applying a third voltage to the capping layer and the lower portion of the semiconductor substrate by the voltage application section to form a third depletion layer on the photodiode, generating a third signal by the charge detection section, and outputting red, green, and blue signal by the signal operation section in accordance with the first to third signals generated by the change detection section.

Outputting red, green, and blue signals by the signal operation section may include performing a Fourier transform with respect to the first to third signals generated by the charge detection section. A width of each of the first to third depletion layers may be adjusted by the first to third voltages, respectively, to correspond to predetermined wavelengths. Applying the first voltage may include applying about 0 V, and generating the first signal may include detecting charges generated in proportion to a red wavelength incident on the photoelectric conversion section. Applying the second voltage may include applying a negative voltage having a larger absolute value than the first voltage, and generating the second signal may include detecting charges generated in proportion to red and green wavelengths incident on the photoelectric conversion section. Applying the second voltage may include forming the second depletion layer at a depth of about 0.5 to 0.8 μm, as measured from the upper surface of the semiconductor substrate. Applying the third voltage may include applying a negative voltage having a larger absolute value than the second voltage, and generating the third signal may include detecting charges generated in proportion to red, green, and blue wavelengths. Applying the third voltage may include forming the third depletion layer to have a width substantially equal to a distance between the upper surface of the photodiode and an upper surface of the capping layer.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
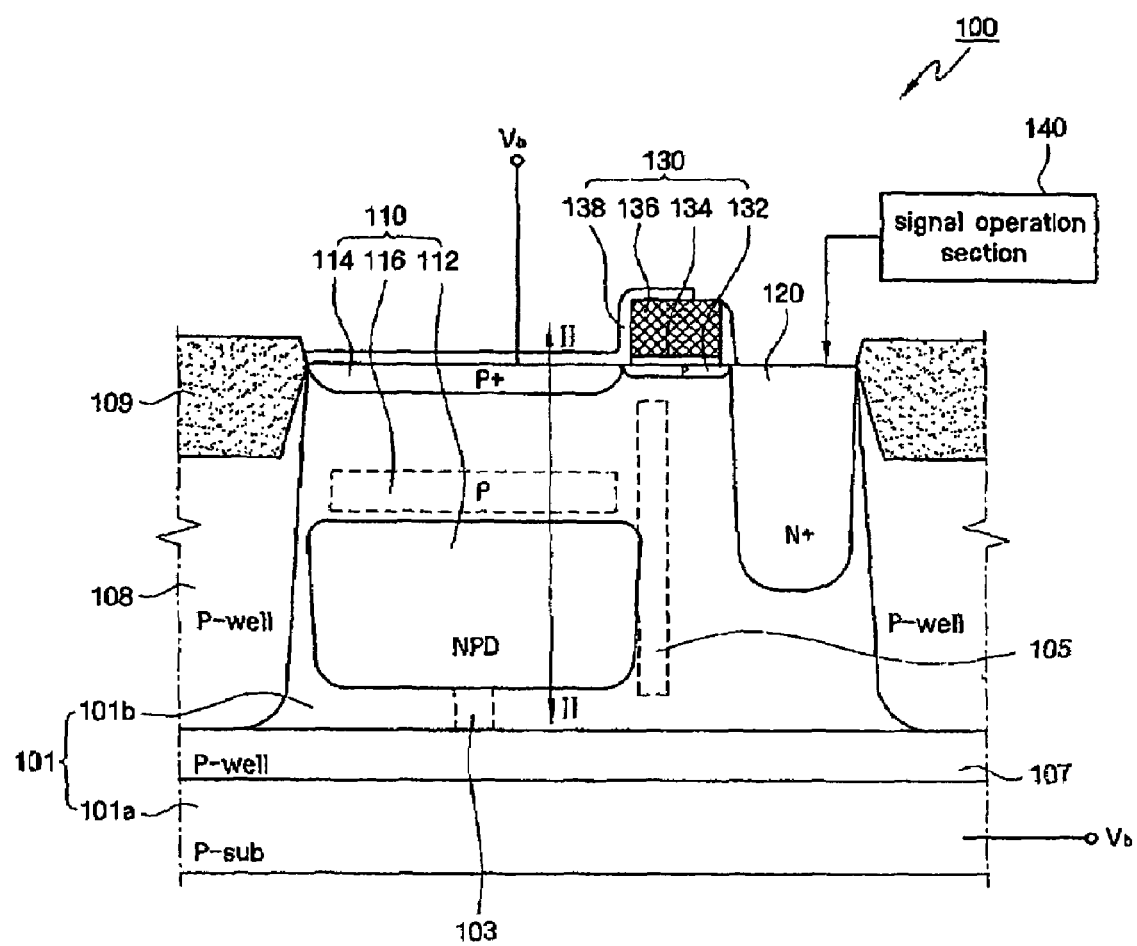
FIG. 1 illustrates a cross-sectional view of a unit pixel of an image sensor according to an embodiment of the present invention.

Korean Patent Application No. 10-2007-0007665 filed on Jan. 24, 2007, in the Korean Intellectual Property Office, and entitled: "Image Sensor, Method of Manufacturing the Same, and Method of Sensing Image," is incorporated by reference herein in its entirety.

Embodiments of the present invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

An "image sensor" hereinafter may refer to a charge coupled device (CCD) and/or a complimentary metal-oxide semiconductor (CMOS) image sensor. The CCD may refer to a device having lower noise and higher image quality than the CMOS image sensor, while having higher voltage and processing costs than the CMOS image sensor. The CMOS image sensor may refer to a signal processing circuit in a single chip, and may be capable of providing a device with a minimized size, reduced production costs, and low power consumption. It should be noted that the image sensor according to an embodiment of the present invention is described hereinafter as a CMOS image sensor for convenience purposes only, and either a CMOS image sensor or a CCD may be employed in an embodiment of the present invention.

Hereinafter, a unit pixel of an image sensor according to an embodiment of the present invention will be described in more detail below with reference to FIG. 1. Referring to FIG. 1, a unit pixel 100 of an image sensor may include a semiconductor substrate 101, a photoelectric conversion section 110, a charge detection section 120, a charge transfer section 130, a voltage application section Vb, and a signal operation section 140. The image sensor according to an embodiment of the present invention may include a plurality of unit pixels 100 on the semiconductor substrate 101, the plurality of unit pixels 100 being electrically connected to the voltage application section Vb and to the signal operation section 140.

The semiconductor substrate 101 of the image sensor may be any suitable substrate, e.g., a silicon substrate, a silicon on insulator (SOI) substrate, a gallium arsenic substrate, a silicon germanium substrate, a ceramic substrate, a quartz substrate, a display glass substrate, and so forth. The semiconductor substrate 101 may be formed to have a first conductivity type, e.g., N-type, or a second conductivity type, e.g., P-type, as illustrated in FIG. 1. The semiconductor substrate 101 may be divided into lower and upper substrate regions 101a and 101b. A deep well 107 may be formed between the lower and upper substrate regions 101a and 101b, while an isolation well 108 and an element isolation region 109 may be formed in the upper substrate region 101b. Additionally, the semiconductor substrate 101 may include a vertical barrier layer 105 and a horizontal barrier layer (not shown).

More specifically, the deep well 107 may be formed to have a second conductivity type, e.g., P-type, and may be formed to a predetermined depth in the semiconductor substrate 101 to define the lower and upper substrate regions 101a and 101b, as illustrated in FIG. 1. It should be noted, however, that the first and second conductivity types hereinafter will refer to the N-type and P-type, respectively, solely for convenience, and that the first and second conductivity types may be reversed, i.e., the first conductivity type may be the P-type and the second conductivity type may be the N-type.

The deep well 107 may form a barrier between the lower and upper substrate regions 101a and 101b, so that charges generated in a bottom portion of the lower substrate region 101a may be prevented from reaching an upper portion of the upper substrate region 101b, e.g., the photoelectric conversion section 110. Further, the deep well 107 may increase recombination between charges and holes. Therefore, the deep well 107 may reduce random drift of charges between adjacent unit pixels, thereby substantially reducing cross-talk between adjacent unit pixels.

The element isolation regions 109 may be formed in the upper substrate region 101b to define a plurality of active regions, i.e., a region including a photodiode 112, e.g., an N-type photodiode (NPD), so that each active region may correspond to a unit pixel 100 of the image sensor. The element isolation region 109 may have, e.g., a field oxide (FOX) structure or a shallow trench isolation (STI) structure, using a local oxidation of silicon (LOCOS) method.

The isolation well 108 may be formed to have the second conductivity type, e.g., P-type, and may be positioned in the upper substrate region 101b below the element isolation regions 109. More specifically, the isolation well 108 may extend vertically from the element isolation region 109 toward the deep well 107, as illustrated in FIG. 1, to provide a barrier between photodiodes 112 of adjacent unit pixels 100. In other words, the isolation well 108 may be positioned between every two photodiodes 112 to reduce cross-talk therebetween in a horizontal direction. Accordingly, the isolation well 108 may extend deeper than the photodiode 112 with respect to an upper surface of the unit pixel 100, e.g., the isolation well may be formed to be in direct contact with the deep well 107, as illustrated in FIG. 1.

The vertical barrier layer 105 may be formed in the upper substrate region 101b of each unit pixel 101 and adjacent to the photoelectric conversion section 110, as illustrated in FIG. 1, to prevent or substantially minimize overlap of the photodiode 112 with the charge transfer section 130. Accordingly, the vertical barrier layer 105 may extend vertically along the photodiode 112 from a lower surface thereof toward the charge transfer section 130, so an upper edge of the vertical barrier layer 105 may be closer to the upper surface of the unit pixel 100 than a depletion layer (not shown) formed on the photodiode 112. The vertical barrier layer 105 may be formed by, e.g., injecting a P-type dopant ions into the semiconductor substrate 101.

The horizontal barrier layer may be formed in the upper substrate region 101b of each unit pixel 101 between the depletion layer on the photodiode 112 and the charge transfer section 130 to prevent or substantially minimize effects of the photodiode 112 and/or the depletion layer on a dopant region 132 of the charge transfer section 130. If the horizontal barrier layer is not formed in the pixel unit 100, a bias voltage may be applied to the charge transfer section 130 and the charge detection section 120 according to the bias voltage applied to a capping layer 114 of the photoelectric conversion section 110.

The photoelectric conversion section 110 of the unit pixel 100 may be formed in the upper substrate region 101b. The photoelectric conversion section 110 may detect incident light thereon, and may convert the detected incident light into electrical charges. The photoelectric conversion section 110 may include a photodiode 112, the capping layer 114, and a dopant layer 116 between the photodiode 112 and the capping layer 114.

The photodiode 132 of the photoelectric conversion section 110 may be of the first conductivity type, e.g., N-type, and may accumulate charges generated in accordance with light incident thereon. The photodiode 112 may be formed at a predetermined depth in the upper substrate region 101b, so an upper surface of the photodiode 112 may be positioned at a depth, i.e., a vertical distance as measured from the upper surface of the unit pixel 100 in an upward direction, of more than about 1 μm. In this respect, it should be noted that the upper surface of the unit pixel 100 refers to a surface formed in a single plane defined by upper surfaces of at least the charge detection unit 120 and the capping layer 114, as illustrated in FIG. 1, and may also be referred to hereinafter as an upper surface of the semiconductor substrate 101. It should further be noted that the depth of the upper surface of the photodiode 112 is defined as a depth of more than about 1 μm, as determined with respect to a depth green and blue wavelengths may not penetrate through a semiconductor substrate, and therefore, may be modified with respect to a material used to form the semiconductor substrate 103.

The photodiode 112 may include a dopant, i.e., a first conductivity type dopant, concentration of, e.g., about $1 \times 10^{15}$ to $1 \times 10^{18}$ atoms/cm$^3$. It should be noted, however, that other dopant concentrations of the photodiode 112, e.g., concentrations as determined with respect to manufacturing requirements and/or design specifications, are within the scope of the present invention.

The capping layer 114 of the photoelectric conversion section 110 may be, e.g., of a P+ type conductivity, and may be positioned above the photodiode 112 to reduce dark current therein, i.e., reduce generation of electron-hole pairs (EHP) due to potential unstable bonds in the upper substrate region 101b. For example, the capping layer 114 may be positioned so an upper surface thereof may define a portion of the upper surface of the unit pixel 100. The capping layer 114 may include a dopant concentration of, e.g., about $1 \times 10^{17}$ to $1 \times 10^{20}$ atoms/cm$^3$. It should be noted, however, that other dopant concentrations of the capping layer 114 e.g., concentrations as determined with respect to manufacturing requirements and/or design specifications are within the scope of the present invention.

The dopant layer 116 of the photoelectric conversion section 110 may be of the second conductivity type, e.g., P-type, and may be formed between the photodiode 112 and the capping layer 114. In particular, the dopant layer 116 may be formed directly on the photodiode 312 to adjust the depth of the photodiode 112 via adjustment of dopant concentration in the dopant layer 116. In other words, variation of the dopant concentration within the dopant layer 116 with respect to the dopant concentration within the photodiode 112 may facilitate formation of the upper surface of the photodiode 112 at a predetermined depth, as will be described in more detail below with respect to FIG. 2. The dopant layer 116 may be formed so that an interface between a first type dopant layer, e.g., N-type dopant, injected to form the photodiode 112, and a second type dopant layer, e.g., P-type dopant, injected to form the dopant layer 116, may have substantially equal concentrations of respective dopants at a substantially similar depth within the semiconductor substrate 100. The interface between the first and second dopant layers may form the upper surface of the photodiode 132. Therefore, a depth at which the first type dopant concentration of the photodiode 112 is substantially similar to a depth and concentration of the second type dopant of the dopant layer 116 may be deeper than about 1 μm.

The maximum dopant concentration of the dopant layer 116 may be at least five times lower than the maximum dopant concentration of the photodiode 112. For example, the dopant layer 116 may have a dopant concentration of, e.g., about $1 \times 10^{14}$ to $1 \times 10^{17}$ atoms/cm$^3$. The dopant layer 116 may be formed to have a lower maximum dopant concentration than the photodiode 112 to facilitate formation of the depletion layer on the upper surface of the photodiode 112 upon application of a bias voltage thereto.

Figure 2:
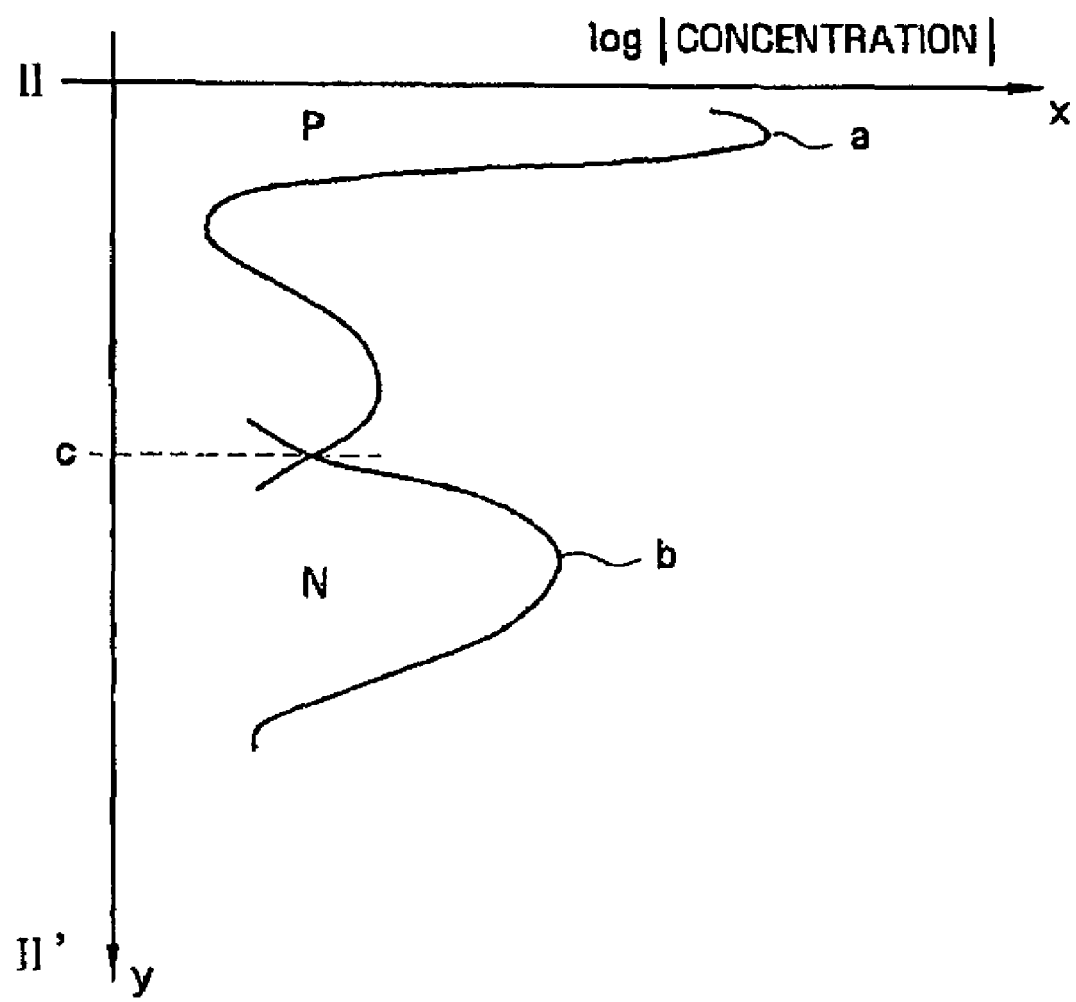
FIG. 2 illustrates a doping concentration profile taken along line II-II' of FIG. 1.

Referring to FIG. 2, the doping concentration of the photoelectric conversion section 110 will be described below with respect to depth. It should be noted that in FIG. 2, an X axis indicates a log value of a doping concentration (ions/cm$^3$) and a Y axis indicates depth as measured with respect to the upper surface of the unit pixel 100, i.e., along line II-II' of FIG. 1. Further, it should be noted that curve "a" indicates concentration of the P-type dopant concentration in the capping layer 114 and dopant layer 116, and curve "b" indicates N-type dopant concentration in the photodiode 112. As illustrated in FIG. 2, curves "a" and "b" intersect at depth "c," thereby indicating a depth within the semiconductor substrate 101 where the N and P dopant concentrations of the photodiode 112 and dopant layer 116, respectively, are substantially identical. Accordingly, depth "c" may indicate a depth of the upper surface of the photodiode 112. As such, the depth of the upper surface of the photodiode 112, i.e., depth "c," may be controlled during formation of the photodiode 112 by adjusting the dopant concentration of the dopant layer 116.

The charge detection section 120 of the unit pixel 100 may be formed in the upper substrate region 101b define a portion of the upper surface of the unit pixel 100, and may be positioned, e.g., between the vertical barrier 105 and the isolation well 108, as illustrated in FIG. 1. The charge detection section 120 may receive charges stored in the photoelectric conversion section 110 through the charge transfer section 130, and may convert the received charges into electrical signals. The charge detection section 120 may be, e.g., of N+ type conductivity.

The charge transfer section 130 of the unit pixel 100 may be electrically connected between the photoelectric conversion section 110 and the charge detection section 120 to transfer charges therebetween. The charge transfer section 130 may include a dopant region 132, a gate insulating layer 134, a transfer gate electrode 136, and a spacer 138.

The dopant region 132 of the charge transfer section 130 may prevent or substantially minimize dark current in the charge transfer section 130 regardless of an operational state thereof, e.g., upon sensing an image when the charge transfer section 130 is turned off. The dopant region 132 may be of the second conductivity type, e.g., P-type, and may be formed in the upper substrate region 101b, e.g., to define a portion of an upper surface of an active region of the unit pixel 100, as illustrated in FIG. 1. For example, the dopant region 132 may be formed up to a depth of about 2000 angstroms.

The gate insulating layer 134 of the charge transfer section 130 may be formed of one or more of silicon oxide (SiO$_2$), silicon oxynitride (SiON), silicon nitride (Si$_x$N$_y$), aluminum oxide (Al$_2$O$_3$), germanium oxynitride (Ge$_x$O$_y$N$_z$), germanium silicon oxide (Ge$_x$Si$_y$O$_z$), a high permittivity material, e.g., hafnium oxide (HfO$_2$), zirconium oxide (ZrO$_2$), aluminum oxide (Al$_2$O$_3$), tantalum oxide (Ta$_2$O$_5$), hafnium silicate (HfSi), zirconium silicate (ZrSi), and so forth. The gate insulating layer 134 may be formed on the dopant region 132 by, e.g., using an atomic layer deposition (ALD) and/or laminating at least two layers of materials indicated above, to a thickness of about 5 to 100 angstroms.

The transfer gate electrode 136 of the charge transfer section 130 may be formed on the gate insulating layer 134 of one or more of conductive polysilicon, metal, e.g., tungsten (W), platinum (Pt), aluminum (Al), and so forth, metal nitride, e.g., titanium nitride (TiN), and/or metal silicide obtained from a reflective metal, e.g., cobalt (Co), nickel (Ni), titanium (Ti), hafnium (Hf), platinum (Pt) and so forth. For example, the transfer gate electrode 136 may be formed by sequentially laminating a conductive polysilicon film and a metallic silicide film or by sequentially laminating the conductive polysilicon film and a metallic film.

The spacer 138 of the charge transfer section 130 may be formed on the transfer gate electrode 336 of, e.g., a nitride film (SiN). For example, the spacer 138 may coat sidewalls of the transfer gate electrode 136, a portion of an upper surface of the transfer gate electrode 136, and/or at least a portion of an upper surface of the capping layer 114, as illustrated in FIG. 1.

The voltage application section Vb of the unit pixel 106 may be electrically connected to the capping layer 11.4 and to the lower substrate region 101a, as illustrated in FIG. 1. The voltage application section Vb may apply a bias voltage to the capping layer 114 and to the lower substrate region 101a of the semiconductor substrate 101 in order to adjust a width, i.e., a vertical distance as measured from the upper surface of the photodiode 312 in an upward direction, of the depletion layer formed on the photodiode 112. More specifically, an increase in the bias voltage applied to the capping layer 114 and lower substrate region 101a by the voltage application section Vb may increase the width of the depletion layer on the photodiode 112 to facilitate light detection, as will be explained in more details below with respect to FIGS. 7A-9B.

The signal operation section 340 of the unit pixel 100 may receive the electrical signals generated by the charge detection section 120 in accordance with variation of bias voltage applied thereto, and may output a corresponding output signal, e.g., by performing a Fourier transform, to operate red, green, and/or blue signals. In detail, application of different bias voltages by the voltage application section Vb may modify the width of the depletion layer of the photoelectric conversion section 110, thereby triggering variation in light detection by the photoelectric conversion section 110. Variation in light detection may, in turn, trigger variation in charges generated by the photoelectric conversion section 1310 and, thereby, detected by the charge detection section 120. The variation in charges detected by the charge detection section 120 may be reflected in a corresponding signal output by the charge detection section 120 to the signal operation section 140. The signal operation section 140 may convert the signal received from the charge detection section 120 using, e.g., the Fourier transform, to operate the red, green, and/or blue signals. In other words, a site unit pixel of the image sensor according to an embodiment of the present invention may detect one or more of red, green, and/or blue wavelengths within light incident thereon; and may process the detected wavelengths into separate electrical signals i.e., red, green, and/or blue signals.

In further detail, a blue wavelength is short, i.e., about 430 to 480 nm, and therefore, may not penetrate a long distance into the semiconductor substrate 101. Accordingly, more than about 80% of the blue wavelength may be absorbed within a depth of about 0.5 μm, as measured from the upper surface of the semiconductor substrate 101. The green wavelength is longer than the blue wavelength, i.e., about 490 to 530 nm, and therefore, may penetrate a further distance into the semiconductor substrate 101 than the blue wavelength. Accordingly, more than about 80% of the green wavelength may be absorbed within a depth of about 1 μm, as measured from the upper surface of the semiconductor substrate 101. The red wavelength is longer than the green wavelength, i.e., about 650 to 700 nm, and therefore, may penetrate a further distance into the semiconductor substrate 101 than the green wavelength. Accordingly, the red wavelength may reach a region positioned deeper than about 1 μm from the upper surface of the semiconductor substrate 101.

In other words, generally only the red wavelength may reach a depth greater than about 1 μm, as measured from the upper surface of the unit pixel 100, both the red and green wavelengths may reach a depth between about 0.5 μm and 1 μm, as measured from the upper surface of the unit pixel 100, and all three wavelengths, i.e., red, green, and blue, may reach a distance shorter than about 0.5 μm, as measured from the upper surface of the semiconductor substrate 101. Accordingly, positioning of the upper surface of the photodiode 112 deeper than about 1 μm, as measured from the upper surface of the unit pixel 100, may provide detection of only the red wavelength by the photodiode 112, i.e., at a state of no voltage application and/or formation of a depletion layer thereon. In this respect, it is noted that penetration distances of wavelengths into the semiconductor substrate 101 as measured from the upper surface of the unit pixel 100 may vary with respect to materials used to form the semiconductor substrate 101, and therefore, other depths distinguishing penetration distances of the red, green, and blue wavelengths into the semiconductor substrate 101 are within the scope of the present invention.

More specifically, according to an embodiment of the present invention, the bias voltage applied to the capping layer 114 and lower substrate region 101a by the voltage application section Vb may be adjusted, so a width of the depletion layer on the photodiode 112 may be substantially negligible when a red wavelength is detected by the photodiode 112. However, the bias voltage may be further adjusted to expand the width of the depletion layer on the photodiode 112 toward the upper surface of the unit pixel 100 in order to detect green or blue wavelengths. In other words, predetermined values of bias voltage may be applied to the capping layer 114 and lower substrate region 101a to adjust the width of the depletion layer on the photodiode 112, so an upper surface of the depletion layer may be at a depth between, e.g., about 1.0 μm and 0.6 μm, or at a depth between, e.g., about 0.4 μm and 0.1 μm, as measured from the upper surface of the unit pixel 100, in order to detect green and blue wavelengths, respectively.

When light is incident on the depletion layer on the photodiode 112, respective charges may be generated and transferred into the photodiode 112 even when light is not directly incident on the photodiode 112. Accordingly, adjustment of the width of the depletion layer to correspond to lengths of green and blue may wavelengths may facilitate transfer of respective charges to the photodiode 112, thereby facilitating detection of the green and blue wavelengths by a photodiode 112 positioned deeper than about 1.0 μm as measured from the upper surface of the unit pixel 100. Accordingly, predetermined values of bias voltage of the voltage application section Vb may be used to adjust the width of the depletion layer on the photodiode 112 to predetermined depths, so charges proportional to red, green, and blue wavelengths may be detected by the charge detection section 120. The signal operation section 140 may perform the Fourier transform with respect to the electrical signals generated by the charge detection section 120 with respect to the detected charges to operate the red, green, and blue signals.

The image sensor according to an embodiment of the present invention may further include a blooming path to remove excess charges from the photodiode 112. For example, the blooming path may be vertical, and may extend, e.g., from a lower surface of the photodiode 112 in a downward direction through the semiconductor substrate 101, e.g., a semiconductor substrate 101 of the first conductivity type. Alternatively, when the semiconductor substrate 101 is of the second conductivity type, excess charges may be removed from the photodiode 112 by, e.g., adjusting the bias voltage to be applied to the capping layer 114 and an overflow voltage to be applied to the lower substrate region 101a. In yet another alternative, the blooming path may be formed between the photodiode 112 and the charge detection section 120 in a horizontal direction to optimize, e.g., charge detection and/or transfer.

The image sensor according to an embodiment of the present invention may be advantageous in providing a device capable of detecting red, green, and/or blue wavelengths without a color filter within a single unit pixel, thereby improving color reproducibility. That is, the image sensor according to an embodiment of the present invention may include a photodiode at a predetermined depth in the semiconductor substrate, so a bias voltage may be used to adjust a width of a depletion layer thereon to detect each of a red, green, and/or blue wavelength according to a respective penetration depth into the semiconductor substrate 101. Since the image sensor according to an embodiment of the present invention may not need a color filter, manufacturing costs and time may be substantially reduced, as compared to an image sensor including a color filter, thereby improving productivity.

A method for forming an image sensor according to an embodiment of the present invention will be described with reference to FIGS. 1 and 3-6.

Figure 3:
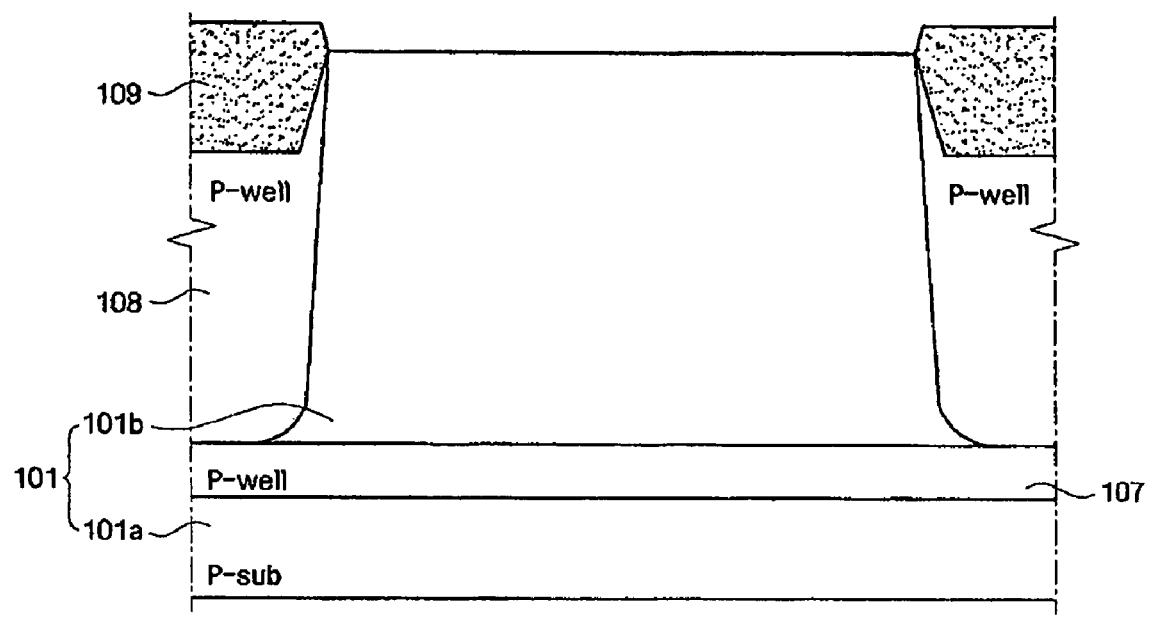
FIGS. 3-6 illustrate cross-sectional views of sequential stages in a method of manufacturing an image sensor according to an embodiment of the present invention.

First, referring to FIG. 3, the semiconductor substrate 101 of the second conductivity type, e.g., P-type, may be provided. Next, the deep well 107 may be formed in the semiconductor substrate 101 by injecting dopant ions of the first conductivity type to a predetermined region of the semiconductor substrate 101, so lower and upper substrate regions 101a and 101b may be formed. For example, the deep well 107 may be formed by injecting P-type boron ions with an injection energy above about 2 MeV, i.e., a dose of about $1\times10^{11}$ to $1\times10^{16}$ ions/cm$^2$, into the semiconductor substrate 101. Accordingly, the deep well 107 may be formed between the lower and upper substrate regions 101a and 101b at a depth of about 3 to 12 μm from the upper surface of the semiconductor substrate 101 and a concentration of about $1\times10^{15}$ to $1\times10^{20}$ atoms/cm$^3$.

Thereafter, the element isolation region 109 may be formed in the upper substrate region 101b of the semiconductor substrate 101 to define the active region of the unit pixel 100 and an area for peripheral circuits (not shown). Next, a dopant of the second conductivity, e.g., P-type, may be injected under the element isolation region 109 to form the isolation well 108. The dopant concentration of the isolation well 108 may be about $1\times10^{16}$ to $1\times10^{18}$ atoms/cm$^3$. The isolation well 108 may extend vertically from the element isolation region 109 toward the deep well 107 to be deeper than the photodiode 112, i.e., a lower surface of the isolation well 108 may be further from the upper surface of the semiconductor substrate 101 than a lower surface of the photodiode 112, as illustrated in FIG. 1.

Figure 4:
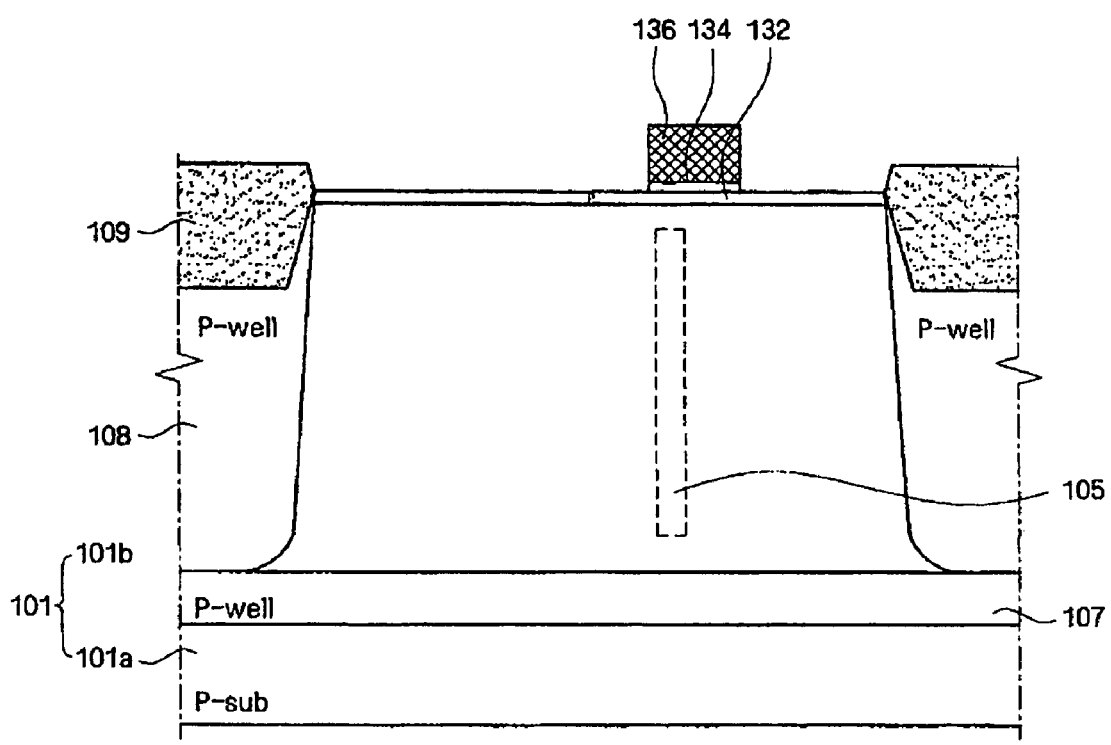

Referring to FIG. 4, the dopant region 132, vertical barrier layer 105, gate insulating layer 134, and transfer gate electrode 136 may be formed in the upper substrate region 101b of the semiconductor substrate 101. The dopant region 132 may be formed, e.g., by injecting a P-type dopant ions, into an upper portion of the semiconductor substrate 101. The vertical barrier layer 105 may be formed, e.g., by injecting a P-type dopant ions, to form a vertical layer within the semiconductor substrate 101, as illustrated in FIG. 4. The gate insulating layer 134 and the transfer gate electrode 136 may be formed by, e.g., sequentially laminating and patterning an insulating material and a conductive film on the dopant region 132. The gate insulating layer 134, transfer gate electrodes 136, and vertical barrier layer 105 may overlap, so that respective side surfaces thereof may align vertically, as illustrated in FIG. 4. In this respect, it should be noted that the vertical alignment of the side surfaces may be adjacent to the photodiode 112.

Figure 5:
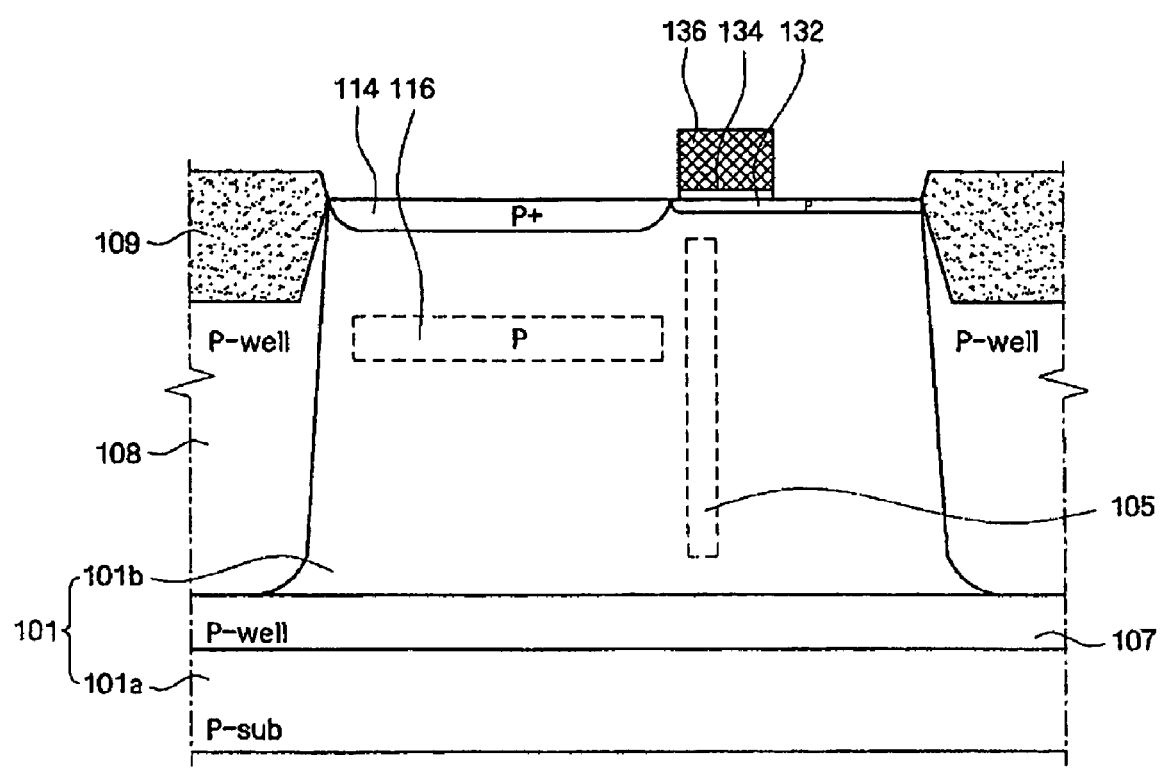

Referring to FIG. 5, the capping layer 114 and the dopant layer 116 may be formed. The capping layer 114 may be formed by, e.g., injecting P-type dopant ions at low energy and high dose into a predetermined region of the upper substrate region 101b. The dopant concentration of the capping layer 114 may be, e.g., $1\times10^{17}$ to $1\times10^{20}$ atoms/cm$^3$. The P-type dopant may be injected at an oblique angle with respect to the upper surface of the semiconductor substrate 101.

The dopant layer 116 may be formed by, e.g., injecting P-type dopant ions with higher energy and lower dose, as compared to the formation of the capping layer 114. Accordingly, the dopant layer 116 may be formed below the capping layer 114 and overlapping therewith. The dopant concentration of the dopant layer 116 may be, e.g., about $1\times10^{14}$ to $1\times10^{17}$ atoms/cm$^3$. The dopant layer 116 may be formed within a depth of about 1 μm as measured from the upper surface of the semiconductor substrate 101, and may be vertically, i.e., along a vertical axis, spaced apart from the capping layer 114. The dopant layer 116 may be horizontally spaced from the vertical barrier layer 105, as further illustrated in FIG. 5.

Figure 6:
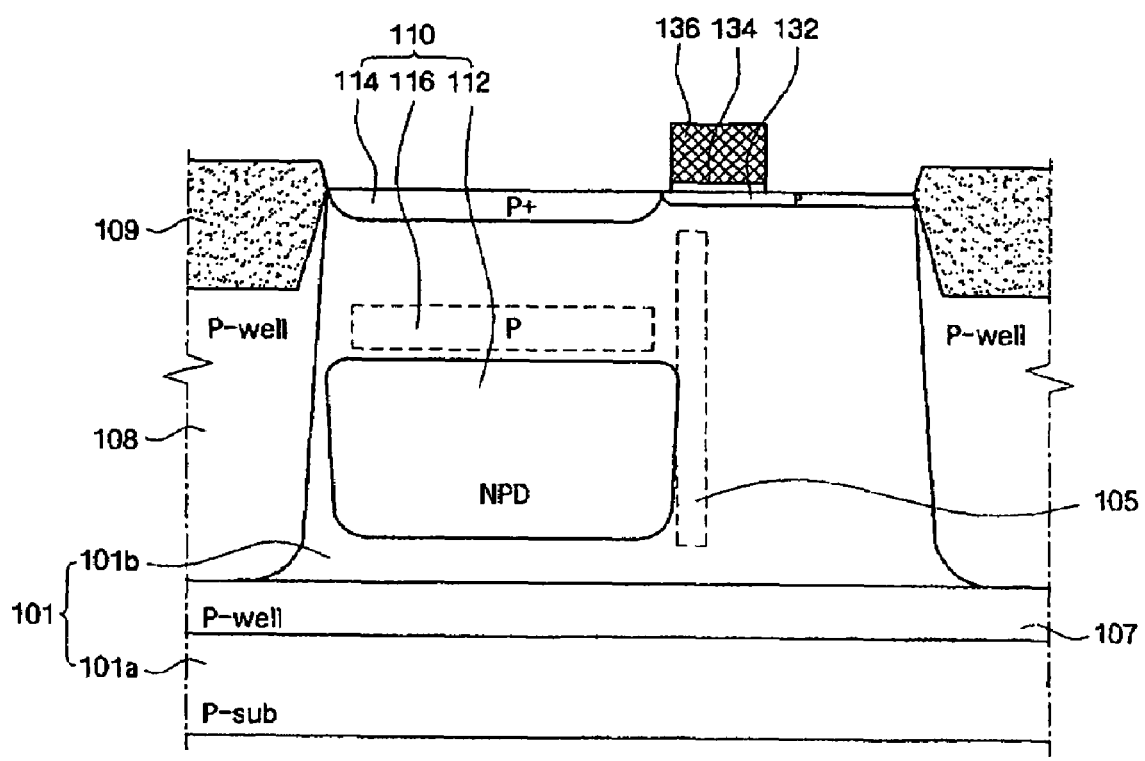

Referring to FIG. 6, the photodiode 112 may be formed by injecting, e.g., N-type dopant ions, into a portion of the semiconductor substrate 101 including the capping layer 114 and the dopant layer 116. The N-type dopant ions may be injected at an oblique angle, e.g., about 0 to 15° with respect to the upper surface of the semiconductor substrate 101 as measured from a direction opposite the transfer gate electrode 136. The N-type dopant ions may be injected from a direction opposite the transfer gate electrode 136 in order to avoid overlap between the photodiode 112 and transfer gate electrode 136. Further, the N-type dopant ions may be injected to form the photodiode 112 with a dopant concentration of about $1\times10^{15}$ to $1\times10^{18}$ atoms/cm$^3$.

The photodiode 112 may be formed between the dopant layer 116 and the capping layer 114, so the upper surface of the photodiode 112 may be formed at a depth greater than about 1 μm as measured from the upper surface of the semiconductor substrate 101. More specifically, the photodiode 112 may be formed directly under the dopant layer 116, so that a region containing a substantially similar concentration of the P-type dopant of the dopant layer 116 and the N-type dopant of the photodiode 112, as illustrated in FIG. 2, may form the upper surface of the photodiode 112. It should be noted, however, that the order of injecting the P-type and N-type dopants in order to form the capping layer 114, dopant layer 116, and photodiode 112 may be determined by one of ordinary skill in the art with respect to manufacturing requirements and design specifications.

Referring to FIG. 1 again, the spacer 138 may be formed by, e.g., chemical vapor deposition (CVD) of an insulating material, such as silicon nitride (SiN), on the semiconductor substrate 101, followed by etching of the insulating material to form the spacer 138; Next, the charge detection section 120 may be formed by injecting, e.g., the N-type dopant ions, into a predetermined region of the semiconductor substrate 101 at a concentration of, e.g., $1\times10^{17}$ to $1\times10^{20}$ atoms/cm$^3$. Then, the voltage applying section Vb may be formed to be electrically connected to the capping layer 114 and lower substrate region 101a. The voltage application section Vb may apply a bias voltage to the capping layer 114 and lower substrate region 101a to adjust the width of the depletion layer formed on the upper portion of the photodiode 112. Subsequently, the signal operation section 140 may be electrically connected to the charge detection section 120 to determine charge variation therein with respect to the width of the depletion layer.

A method of operating an image sensor according to an embodiment of the present invention will be described hereinafter with reference to FIGS. 7A-913.

Figure 7A:
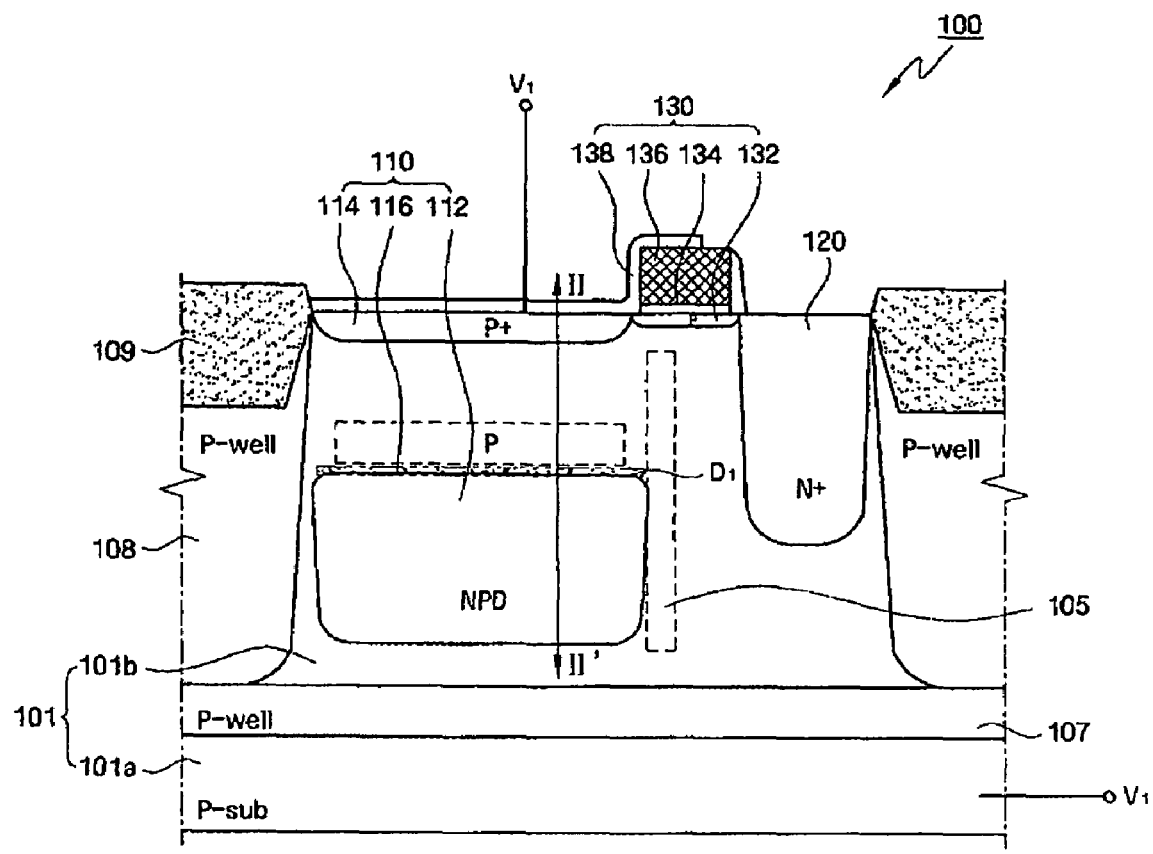
FIGS. 7A-7B illustrate cross-sectional views of a unit pixel of an image sensor according to an embodiment of the present invention and its corresponding charge profile, respectively, during application of a first voltage to the unit pixel.
Figure 7B:
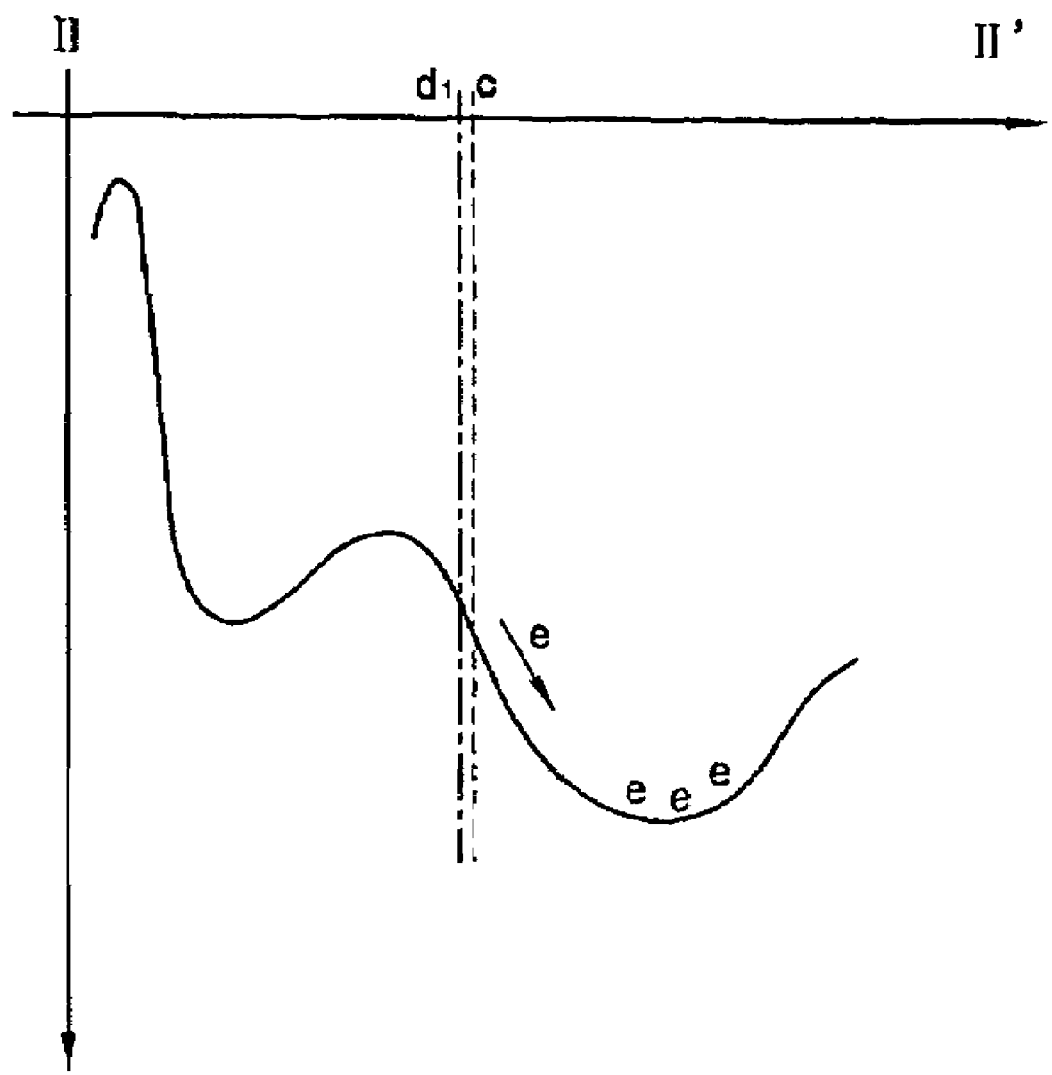

First, referring to FIGS. 7A-7B, after light is incident on the semiconductor substrate 101, a first voltage may be applied to the capping layer 114 and lower substrate region 101a via the voltage application section Vb to form a first depletion layer D1 having a first width. The first voltage may be substantially low, e.g., about 0 V, so the first width of the first depletion layer D1 may be very thin, i.e., negligible, as illustrated in FIG. 7A. When the dopant concentration of the photodiode 112 is larger than the dopant concentration of the dopant layer 116, the first depletion layer DJ may extend from the upper surface of the photodiode 112, i.e., at a depth c in FIG. 7B, in an upward direction toward the dopant layer 116, as illustrated in FIG. 7A. Line d1 in FIG. 7B indicates the depth of an upper surface of the first depletion layer D1 as measured from the upper surface of the unit pixel 100.

During application of the first voltage, the first depletion layer D1 may be very thin, so only a wavelength of light capable of penetrating the semiconductor substrate 101 to a depth that at least substantially equals a depth of the upper surface of the photodiode 112 may be detected by the photodiode 112. In other words, the photodiode 112 may be formed so only a red wavelength may be detected by the photodiode 112 during application of the first voltage. For example, the photodiode 112 may be formed so the upper surface thereof may be positioned deeper than about 1 μm as measured from the upper surface of the unit pixel 100, so the photodiode 112 may generate and store charges only in proportion to an amount of red wavelength in the light incident on the semiconductor substrate 101.

As illustrated in FIG. 7B, i.e., a profile of charges along line II-II' of FIG. 7A, only charges generated substantially on the upper surface of the photodiode 112, i.e., depth c, or deeper may converge in the photodiode 112. The charges stored in the photodiode 112, i.e., charges corresponding to the red wavelength detected in the incident light, may be transferred to the charge detection section 120 through the charge transfer section 130. The charge detection section 120 may generate a first signal to correspond to the charges received from the charge transfer section 130, i.e., a signal corresponding to the red wavelength.

Figure 8A:
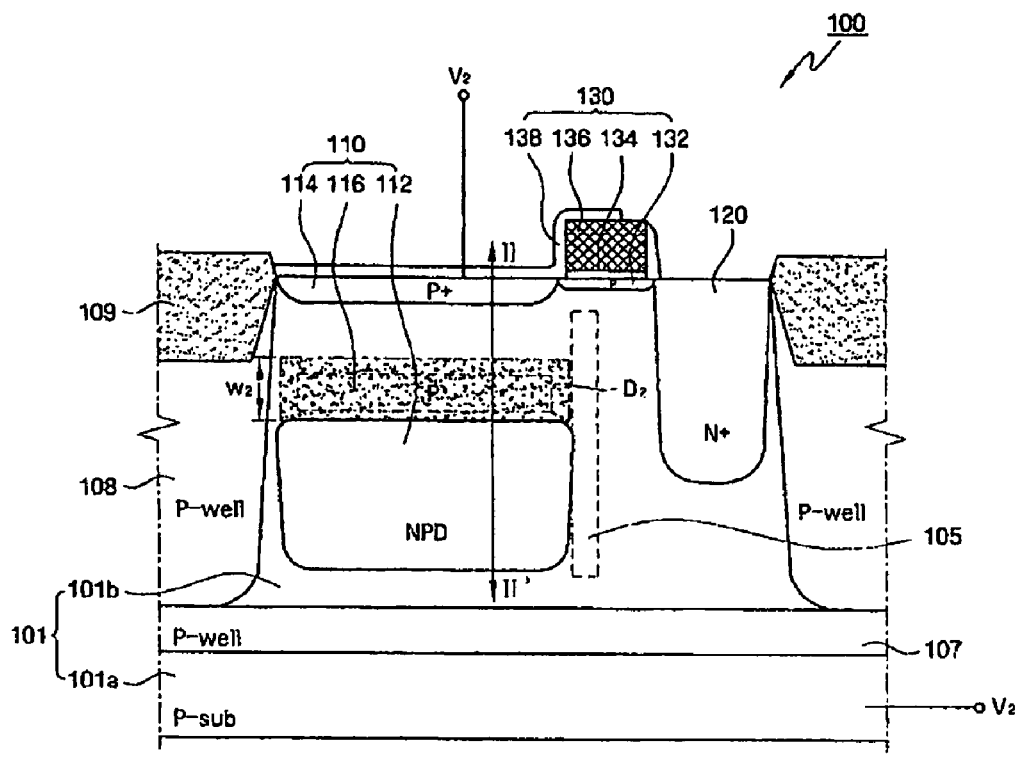
FIGS. 8A-8B illustrate cross-sectional views of a unit pixel of an image sensor according to an embodiment of the present invention and its corresponding charge profile, respectively, during application of a second voltage to the unit pixel.
Figure 8B:
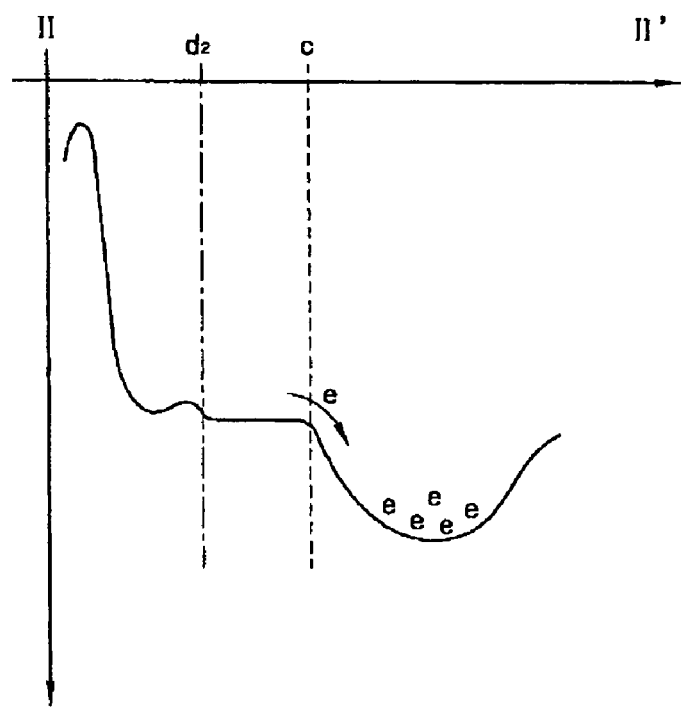

Next, referring to FIGS. 8A-8B, a second voltage may be applied to the capping layer 114 and lower substrate region 101a via the voltage application section Vb. The second voltage may have a negative value having an absolute value larger than an absolute value of the first voltage. When the second voltage is applied to the capping layer 114 and lower substrate region 101a, a second depletion layer D2 having a second width w2 may be formed on the photodiode 112 to overlap with the dopant layer 116, as illustrated in FIG. 8A.

The second depletion layer D2 may be wider than the first depletion layer D1, e.g., the second depletion layer D2 Extend between depths of about 0.5 μm and 0.8 μm as measured from the upper surface of the unit pixel 100, i.e., a depth not accessible by the blue wavelength. That is, the second voltage may be adjusted to form the second depletion layer D2 to extend vertically from the photodiode 112 toward the upper surface of the unit pixel 100 in order to substantially cover a depth between about 0.5 μm to 1.0 μm as measured from the upper surface of the unit pixel 100, i.e., a depth accessible by both the green and red wavelengths but not by the blue wavelength. Accordingly, charges generated in the second depletion layer D2 due to potential difference therein may correspond to an amount of red and green wavelengths in the light incident on the semiconductor substrate 101.

As illustrated in FIG. 8B, i.e., a profile of charges along line II-II' of FIG. 8A, charges generated within the second depletion layer D2, i.e., between the depths d2 and c, substantially converge into the photodiode 112. The charges stored in the photodiode 112, i.e., charges corresponding to the red and green wavelengths detected in the incident light, may be transferred to the charge detection section 120 through the charge transfer section 130. The charge detection section 120 may generate a second signal to correspond to charges received from the charge transfer section 130, i.e., a signal corresponding to the red and green wavelengths.

Figure 9A:
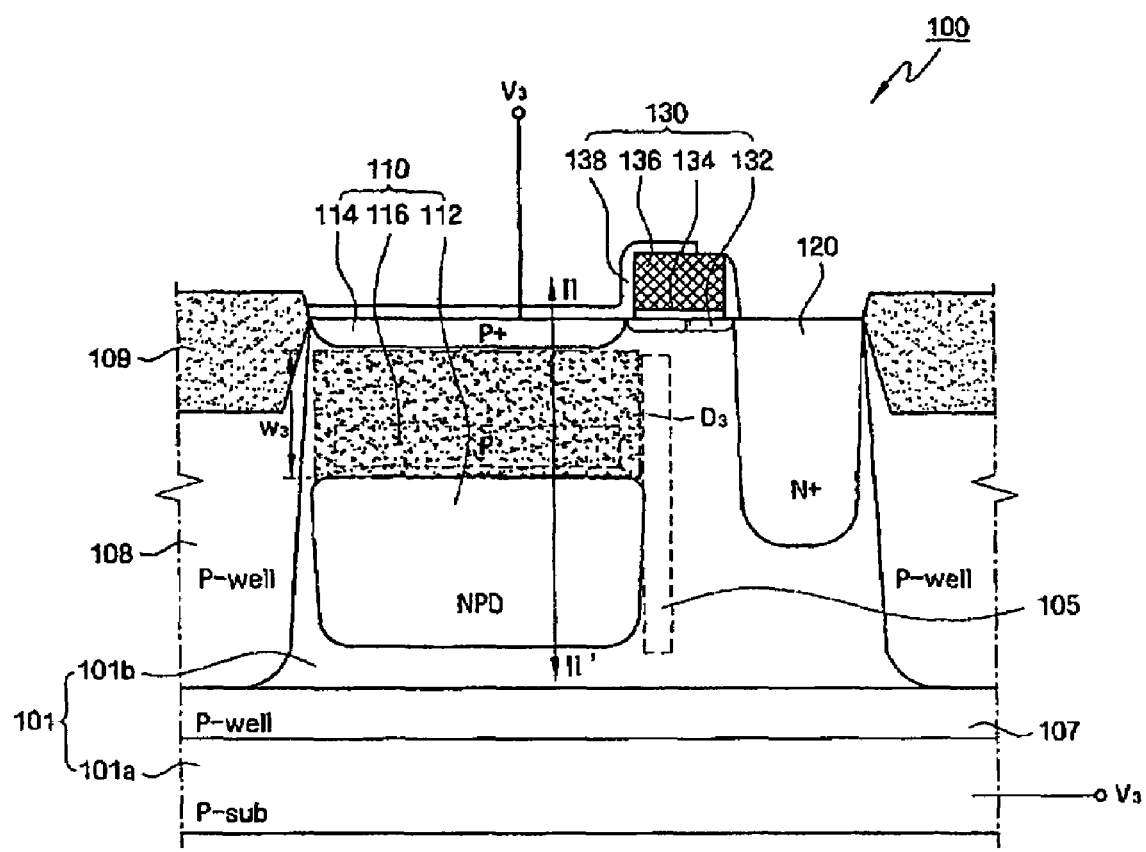
FIGS. 9A-9B illustrate cross-sectional views of a unit pixel of an image sensor according to an embodiment of the present invention and its corresponding charge profile, respectively, during application of a third voltage to the unit pixel.
Figure 9B:
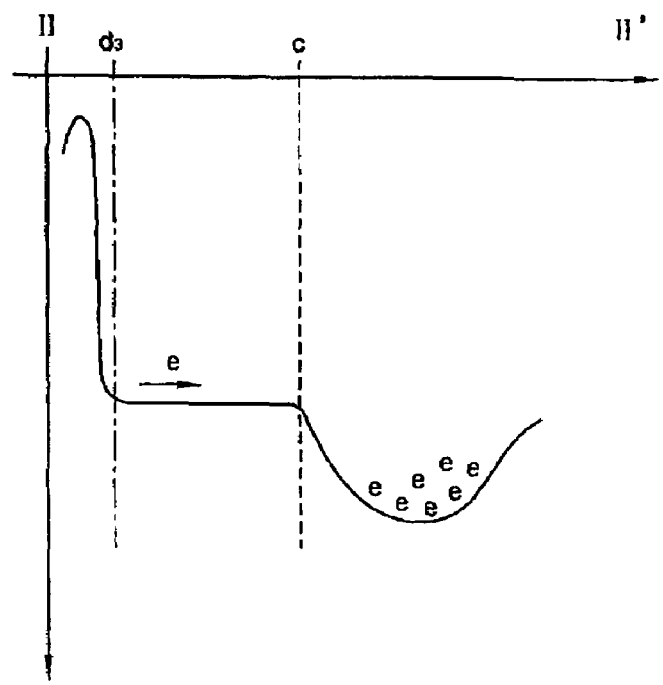

Next, referring to FIGS. 9A-9B, a third voltage may be applied to the capping layer 134 and lower substrate region 101a via the voltage application section Vb. The third voltage may have a negative value having an absolute value larger than the absolute value of the second voltage. When the third voltage is applied to the capping layer 114 and lower substrate region 101a, a third depletion layer D3 having third width w3 may be formed on the photodiode 112 to overlap with the dopant layer 116. The third depletion layer D3 may be wider than the second depletion layer D2, and may, e.g., substantially cover an entire region between the photodiode 112 and the capping layer 114, as illustrated in FIG. 9A.

In other words, the third voltage may be adjusted to form the third depletion layer D3 to extend between the photodiode 112 and upper surface of the unit pixel 100 in order to substantially cover a depth directly below the capping layer 114 and extending to contact the photodiode 112, i.e., a depth accessible by the red, green, and blue wavelengths. Accordingly, charges generated in the third depletion layer D3 may correspond to an amount of red, green, and blue wavelengths in the light incident on the semiconductor substrate 101.

As illustrated in FIG. 9B, i.e., a profile of charges along line II-II' of FIG. 9A, charges generated within the third depletion layer D3, i.e., between the depths d3 and c, substantially converge into the photodiode 112. The charges stored in the photodiode 112, i.e., charges corresponding to the red, green, and blue wavelengths detected in the incident light, may be transferred to the charge detection section 120 through the charge transfer section 130. The charge detection section 120 may generate a third signal corresponding to charges received from the charge transfer section 130, i.e., a signal corresponding to red, green, and blue wavelengths.

Thereafter, the first, second, and third signals generated by the charge detection section 120 may be transmitted to the signal operation section 140 for generating corresponding red, green, and blue signals. More specifically, the first, second, and third signals generated by the charge detection section 120 may correspond to charges with respect to the red wavelength, charges with respect to the red and green wavelengths, and charges with respect to the red, green, and blue wavelengths, respectively. The signal operation section 140 may perform the Fourier transform with respect to the first, second, and third signals generated by the charge detection section 120 in order to determined relative amounts of red, green, and blue color in the light incident on the unit pixel 100.

In particular, the signal operation section may perform the Fourier transform with respect to the first to third signals generated by the charge detection section 120, and may apply the transformed values to Equations 1-2 described below. More specifically, when the first voltage is applied, a first signal $Q_R(t)$ may be generated with respect to an amount of light $P_R(\omega)$ corresponding to the red wavelength. When the second voltage is applied, a second signal $Q_{RG}(t)$ may be generated with respect to an amount of light $P_{RG}(\omega)$ corresponding to the red and the green wavelengths. When the third voltage is applied, a third signal $Q_{RGB}(t)$ may be generated with respect to an amount of light $P_{RGB}(\omega)$ corresponding to the red, green, and blue wavelengths. Accordingly, an amount of light $P_B(\omega)$ corresponding only to the blue wavelength, for example, may be calculated according to equation 1 below.

$$P_{RGB}(\omega)-P_{RG}(\omega)=P_B(\omega) \quad \text{Equation 1}$$

Once the amount of light $P_B(\omega)$ corresponding to the blue wavelength is calculated, the amount of light $P_G(\omega)$ corresponding only to the green wavelength may be calculated according to equation 1 below. In this respect, it is noted that the amount of light $P_R(\omega)$ corresponding to the red wavelength is determined by the first voltage, and therefore, does not require separate calculations.

$$P_{RG}(\omega)-P_R(\omega)=P_G(\omega) \quad \text{Equation 2}$$

Accordingly, the amount of light corresponding to each of the red, green, and blue wavelength may be calculated by performing the Fourier transform with respect to the first to third signals $Q_R(t)-Q_{RGB}(t)$, followed by application of the transformed values to Equations 1-2 in order to satisfy Equations 3-5 below.

$$F\{Q_{RGB}(t)\}-F\{Q_{RG}(t)\}=F\{Q_B(t)\} \quad \text{Equation 3}$$

$$F\{Q_{RG}(t)\}-F\{Q_R(t)\}=F\{Q_B(t)\} \quad \text{Equation 4}$$

$$F\{Q_R(t)\}=F\{Q_R(t)\} \quad \text{Equation 5}$$

Even though the operation of the image sensor according to an embodiment of the present invention was described above by using the Fourier transform to calculate the light amount corresponding to each of the red, green, and blue wavelengths, other methods are not excluded from the scope of the present invention.

A processor-based system 300 for processing a signal output from the signal operation section 140 of an image sensor according to an embodiment of the present invention will be described n more detail below with respect to FIG. 10. More specifically, the processor-based system 300 may process signal outputs of a plurality of unit pixels, e.g., a CMOS image sensor 310 through the signal operation section 140, to generate an image. For convenience, the processor-based system 300 may be exemplified to include a computer system, a camera system, a scanner, a mechanized clock system, a navigation system, a video phone, a monitor system, an auto focus system, a chase system, an operation monitoring system, or an image stabilization system, but the invention is not limited thereto.

Figure 10:
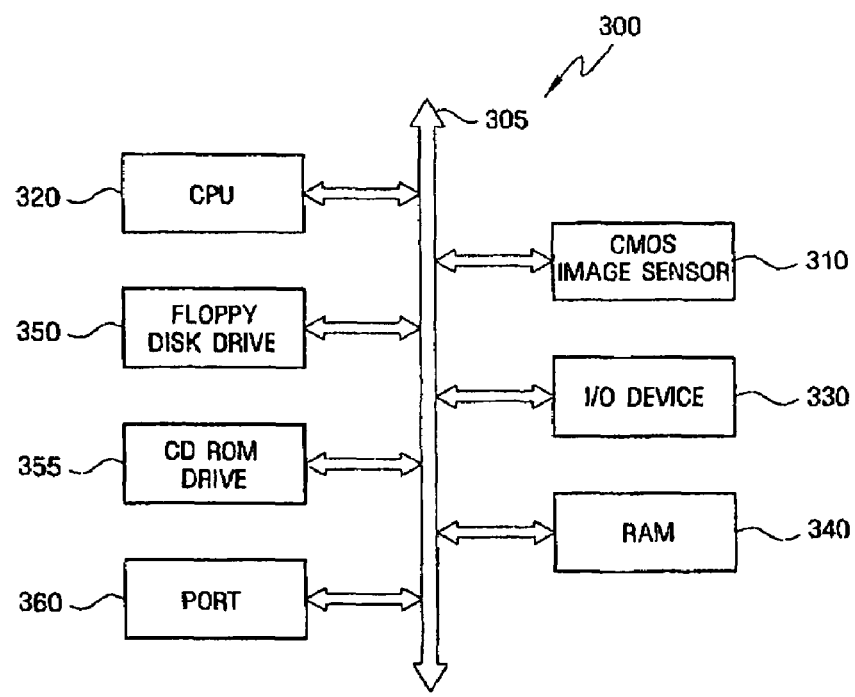
FIG. 10 illustrates a schematic block diagram of a processor-based system including an image sensor according to an embodiment of the present invention.

For example, as illustrated in FIG. 10, the processor-based system 300 may include a central processing unit (CPU) 320, e.g., a microprocessor, an input/output (I/O) device 330, a floppy disk drive 350, a CD ROM drive 355, a RAM 340, and CMOS image sensor 310 electrically connected through, e.g., a bus 305 or another communication link. The processor-based system 300 may further include a port 360 electrically connecting a video card, a sound card, and/or a memory card via a USB element to any one of the system elements above. For example, the CMOS image sensor 310 may be integrated with the CPU 320 and/or with a digital signal processing (DSP) device (not shown). Alternatively, the CMOS image sensor 310 may be integrated with a memory, and may be mounted on a chip separately from the CPU 320.

An image sensor according to an embodiment of the present invention, a method of manufacturing the same, and a method of operating the same may be advantageous for several reasons. First, the image sensor may reproduce colors without color filters. Second, manufacturing costs and time of the image sensor may be reduced due to lack of need to produce color filters; thereby providing superior products and improving productivity. Third, the image-sensor may facilitate detection and implementation of three light wavelengths, i.e., red, green, and blue lights, by a single unit pixel without a color filter, thereby substantially improving color reproducibility.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An image sensor, comprising:
a photoelectric conversion section in a semiconductor substrate, the photoelectric conversion section having a capping layer of a first conductivity type and a photodiode of a second conductivity type below the capping layer, the photodiode being positioned to have an upper surface thereof deeper than about 1 μm as measured from an upper surface of the semiconductor substrate;
a charge transfer section adapted to receive charges stored in the photoelectric conversion section, the charges corresponding to light incident on the photoelectric conversion section;
a charge detection section adapted to receive the charges from the charge transfer section and to convert the received charges into respective electrical signals;
a voltage application section adapted to apply voltage to the capping layer and to a lower portion of the semiconductor substrate to control a width of a depletion layer on the photodiode; and
a signal operation section adapted to receive the electrical signals from the charge detection section to generate red, green, and blue signals.

2. The image sensor as claimed in claim 1, wherein the photoelectric conversion section further comprises a dopant layer of the first conductivity type between the capping layer and the photodiode.

3. The image sensor as claimed in claim 2, wherein the dopant layer is in direct contact with the photodiode.

4. The image sensor as claimed in claim 2, wherein a maximum dopant concentration of the photodiode is at least five times higher than a maximum dopant concentration of the dopant layer.

5. The image sensor as claimed in claim 2, wherein the depletion layer overlaps with the dopant layer.

6. The image sensor as claimed in claim 1, wherein the signal operation section is adapted to perform a Fourier transform with respect to the electrical signals received from the charge detection section.

7. The image sensor as claimed in claim 3, wherein the semiconductor substrate is of the first conductivity type or of the second conductivity type.

8. The image sensor as claimed in claim 3, further comprising a vertical blooming path between the lower portion of the semiconductor substrate and the photodiode.

9. The image sensor as claimed in claim 1, further comprising a vertical barrier layer along the photoelectric conversion section.

10. A method of manufacturing an image sensor, the method comprising:
forming a photoelectric conversion section with a capping layer of a first conductivity type and a photodiode of a second conductivity type below the capping layer in a semiconductor substrate, the photodiode formed such that an upper surface thereof is deeper than about 1 μm, as measured from an upper surface of the semiconductor substrate;
forming a charge transfer section adapted to receive charges stored in the photoelectric conversion section, the charges corresponding to light incident on the photoelectric conversion section;
forming a charge detection section adapted to receive the charges from the charge transfer section and to convert the received charges into respective electrical signals;
forming a voltage application section adapted to apply voltage to the capping layer and a lower portion of the semiconductor substrate to control a width of a depletion layer on the photodiode; and
forming a signal operation section adapted to receive the electrical signals from the charge detection section to generate red, green, and blue signals.

11. The method as claimed in claim 10, wherein forming the photoelectric conversion section includes injecting first conductivity type dopant ions into the semiconductor substrate, such that a dopant layer is formed between the capping layer and the photodiode.

12. The method as claimed in claim 11, wherein forming the photoelectric conversion section includes injecting second conductivity type dopant ions into the semiconductor substrate to form the photodiode, such that a maximum dopant concentration in the photodiode is at least five times higher than a maximum dopant concentration in the dopant layer.

13. The method as claimed in claim 11, wherein forming the photoelectric conversion section includes adjusting a dopant concentration of the dopant layer to be substantially equal to a dopant concentration of the photodiode at a depth of about 1 μm or deeper, as measured from the upper surface of the semiconductor surface.

14. A method of operating an image sensor including a semiconductor substrate, a charge detection section, a charge transfer section, a voltage application section, a signal operation section, and a photoelectric conversion section having a capping layer of a first conductivity type and a photodiode of a second conductivity type below the capping layer in the semiconductor substrate, the photodiode being positioned to have an upper surface thereof deeper than about 1 μm as measured from an upper surface of the semiconductor substrate, the method comprising:

radiating light toward the semiconductor substrate;

applying a first voltage to the capping layer and a lower portion of the semiconductor substrate by the voltage application section to form a first depletion layer on the photodiode;

generating a first signal by the charge detection section;

applying a second voltage to the capping layer and the lower portion of the semiconductor substrate by the voltage application section to form a second depletion layer on the photodiode;

generating a second signal by the charge detection section;

applying a third voltage to the capping layer and the lower portion of the semiconductor substrate by the voltage application section to form a third depletion layer on the photodiode;

generating a third signal by the charge detection section; and outputting red, green, and blue signals by the signal operation section in accordance with the first to third signals generated by the charge detection section.

15. The method as claimed in claim 14, wherein outputting red, green, and blue signals by the signal operation section includes performing a Fourier transform with respect to the first to third signals generated by the charge detection section.

16. The method as claimed in claim 14, wherein a width of each of the first to third depletion layers is adjusted by the first to third voltages, respectively, to correspond to predetermined wavelengths.

17. The method as claimed in claim 16, wherein applying the first voltage includes applying about 0 V, and wherein generating the first signal includes detecting charges generated in proportion to a red wavelength incident on the photoelectric conversion section.

18. The method as claimed in claim 16, wherein applying the second voltage includes applying a negative voltage having a larger absolute value than the first voltage, and wherein generating the second signal includes detecting charges generated in proportion to red and green wavelengths incident on the photoelectric conversion section.

19. The method as claimed in claim 18, wherein applying the second voltage includes forming the second depletion layer at a depth of about 0.5 to 0.8 μm, as measured from the upper surface of the semiconductor substrate.

20. The method as claimed in claim 16, wherein applying the third voltage includes applying a negative voltage having a larger absolute value than the second voltage, and wherein generating the third signal includes detecting charges generated in proportion to red, green, and blue wavelengths.

21. The method as claimed in claim 20, wherein applying the third voltage includes forming the third depletion layer to have a width substantially equal to a distance between the upper surface of the photodiode and a lower surface of the capping layer.

* * * * *